United States Patent
Wang

(10) Patent No.: US 10,541,264 B2
(45) Date of Patent: Jan. 21, 2020

(54) PACKAGE-ON-PACKAGE STRUCTURE AND PACKAGE-ON-PACKAGE METHOD

(71) Applicant: China Wafer Level CSP Co., Ltd., Suzhou, Jiangsu (CN)

(72) Inventor: Zhiqi Wang, Jiangsu (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 0 days.

(21) Appl. No.: 16/194,080

(22) Filed: Nov. 16, 2018

(65) Prior Publication Data

US 2019/0165028 A1    May 30, 2019

(30) Foreign Application Priority Data

Nov. 29, 2017  (CN) .......................... 2017 1 1226357
Nov. 29, 2017  (CN) ...................... 2017 2 1631766 U

(51) Int. Cl.
*H01L 25/065*  (2006.01)
*H01L 27/146*  (2006.01)

(52) U.S. Cl.
CPC .... *H01L 27/14634* (2013.01); *H01L 27/1469* (2013.01); *H01L 27/14618* (2013.01); *H01L 27/14627* (2013.01); *H01L 27/14636* (2013.01)

(58) Field of Classification Search
CPC ............... H01L 25/043; H01L 25/0657; H01L 25/0652; H01L 25/0655; H01L 25/0753; H01L 25/0756
See application file for complete search history.

(56) References Cited

U.S. PATENT DOCUMENTS

| | | | |
|---|---|---|---|
| 2011/0141318 A1* | 6/2011 | Lee ................... | H01L 27/14618 348/240.2 |
| 2018/0138153 A1* | 5/2018 | Kinoshita ................. | G06T 1/20 |

* cited by examiner

*Primary Examiner* — Jae Lee
(74) *Attorney, Agent, or Firm* — Wolf, Greenfield & Sacks, P.C.

(57) ABSTRACT

A package-on-package structure of an image sensing chip is provided, which includes: an image sensing chip package, a control chip package and a circuit board. The image sensing chip package and the control chip package are arranged on the same surface of the control chip package in parallel. The image sensing chip package includes a first substrate and an image sensing chip. The control chip package includes a second substrate and a control chip. A second surface of the first substrate is electrically connected to a first region of a first surface of the second substrate, and the circuit board is electrically connected to a second region of the first surface of the second substrate. A package-on-package method for a package-on-package structure is further provided.

20 Claims, 16 Drawing Sheets

| Provide an image sensing chip package 10, a control chip package 20 and a circuit board 30, the image sensing chip package 10 includes a first substrate 11 and an image sensing chip 12, the first substrate includes a first surface 11a and a second surface 11b opposite to each other, the image sensing chip 12 is electrically connected to the first surface 11a of the first substrate 11, the control chip package 20 includes a second substrate 21 and a control chip 22, the second substrate 21 includes a first surface 21a and a second surface 21b opposite to each other, the first surface 21a of the second substrate includes a first region I and a second region II, and the control chip 22 is located on the second surface 21b of the second substrate 21 and is electrically connected to the second surface 21b of the second substrate 21 | ∼ S1001 |
|---|---|
| Apply a conductive glue 40 on the first region I and the second region II | ∼ S1002 |
| Arrange the image sensing chip package 10 and the circuit board 30 on the first surface 21a of the second substrate 21 in parallel, electrically connect the first region I to the second surface 11b of the first substrate 11, and electrically connect the second region II to the circuit board 30 | ∼ S1003 |

Figure 10

PACKAGE-ON-PACKAGE STRUCTURE AND PACKAGE-ON-PACKAGE METHOD

The present application claims priorities to Chinese Patent Application No. 201711226357.1, titled "PACKAGE-ON-PACKAGE STRUCTURE AND PACKAGE-ON-PACKAGE METHOD", filed on Nov. 29, 2017 with the Chinese Patent Office, and Chinese Patent Application No. 201721631766.5, titled "PACKAGE-ON-PACKAGE STRUCTURE", filed on Nov. 29, 2017 with the Chinese Patent Office, which are incorporated herein by reference in their entireties.

FIELD

The present disclosure relates to the technical field of chip packaging, and in particular to a package-on-package structure and a package-on-package method.

BACKGROUND

With the continuous development of the semiconductor production technology and the three-dimensional packaging technology, increasingly high requirements are imposed on multi-function and miniaturization of electronic devices and electronic products. Under the promotion of the trend of miniaturization, it is required to continuously reduce a packaging size of a chip. According to the International Technology Roadmap for Semiconductors, the miniaturization of a package can be better achieved with a three-dimensional package-on-package (POP) technology.

The three-dimensional package-on-package technology has the following features: a small packaging volume, a large packaging space, a fast signal transmission speed due to a shortened wire, a short product development cycle, a high launch speed and the like. The three-dimensional package-on-package technology is mainly used to handheld devices and digital products such as mobile phones, laptops and digital cameras.

At present, the three-dimensional package-on-package technology is already applied to the field of image sensing chip packaging. A package-on-package structure of a conventional image sensing chip is as shown in FIG. 1. In the package-on-package structure, an image sensing chip package 10 is connected to a surface of a control chip package 20, a flexible printed circuit (FPC) 30 is connected to an opposite surface of the control chip package 20, such that the image sensing chip package 10, the flexible printed circuit (FPC) 30 and the control chip package 20 form a stacking structure.

In the package-on-package structure of the image sensing chip shown in FIG. 1, the flexible printed circuit (FPC) 30 and the image sensing chip package 10 are respectively arranged on two opposite surfaces of the control chip package 20, to form a vertical stacking structure. A total thickness of the vertical stacking structure may be affected by a thickness of each of the flexible printed circuit (FPC) 30, the control chip package 20 and the image sensing chip package 10, resulting in that the package-on-package structure of the image sensing chip has a relative great thickness, which is adverse to the production of a thin and light electronic product.

SUMMARY

In view of the above, a package-on-package structure and a package-on-package method are provided according to the present disclosure. With the package-on-package method, a total thickness of a package-on-package structure of an image sensing chip can be reduced.

In order to solve the above problems, the following technical solutions are provided according to the present disclosure.

A package-on-package structure is provided, which includes an image sensing chip package, a control chip package and a circuit board.

The image sensing chip package includes a first substrate and at least one image sensing chip. The first substrate includes a first surface and a second surface opposite to each other. The image sensing chip is electrically connected to the first surface of the first substrate.

The control chip package includes a second substrate and at least one control chip. The second substrate includes a first surface and a second surface opposite to each other. The first surface of the second substrate includes a first region and a second region.

The control chip is located on the second surface of the second substrate and is electrically connected to the second surface of the second substrate.

The image sensing chip package and the circuit board are located on the first surface of the second substrate. The circuit board is located at a lateral side of the image sensing chip package. The second surface of the first substrate is electrically connected to the first region of the first surface of the second substrate. The circuit board is electrically connected to the second region of the first surface of the second substrate.

A package-on-package method is further provided, which includes:

providing an image sensing chip package, a control chip package and a circuit board, where the image sensing chip package includes a first substrate and at least one image sensing chip, the first substrate includes a first surface and a second surface opposite to each other, and the image sensing chip is electrically connected to the first surface of the first substrate, the control chip package includes a second substrate and at least one control chip, the second substrate includes a first surface and a second surface opposite to each other, the first surface of the second substrate includes a first region and a second region, and the control chip is located on the second surface of the second substrate and is electrically connected to the second surface of the second substrate; and arranging the image sensing chip package and the circuit board on the first surface of the second substrate in parallel, electrically connecting the first region to the second surface of the first substrate, and electrically connecting the second region to the circuit board.

Compared with the conventional technology, the following beneficial effects can be achieved according to the present disclosure. It can be seen from the above technical solutions that, in the package-on-package structure according to the embodiments of the present disclosure, the image sensing chip package and the circuit board are located on the same surface of the control chip package, and the circuit board is located at a lateral side of the image sensing chip package, such that a total thickness of the package-on-package structure may not be affected by a thickness of the circuit board, and the total thickness of the package-on-package structure is a sum of thicknesses of the image sensing chip package and the control chip package. Therefore, compared with a package-on-package structure in the conventional technology, the package-on-package structure according to the embodiments of the present disclosure has a smaller thickness, a better flatness and a simpler structure, thereby reducing a process difficulty, thus facilitating the miniaturization of an image sensor.

BRIEF DESCRIPTION OF THE DRAWINGS

In order to illustrate solutions of the present disclosure and the conventional technology more clearly, drawings to be used in the description of the technical solutions of the present disclosure and the conventional technology are briefly described below. It is apparent that the drawings only illustrate some embodiments of the present disclosure, and other drawings may be obtained by those skilled in the art without any creative work.

FIG. 10 is a flowchart of a package-on-package method for a package-on-package structure of an image sensing chip according to an embodiment of the present disclosure.

Figure 1:
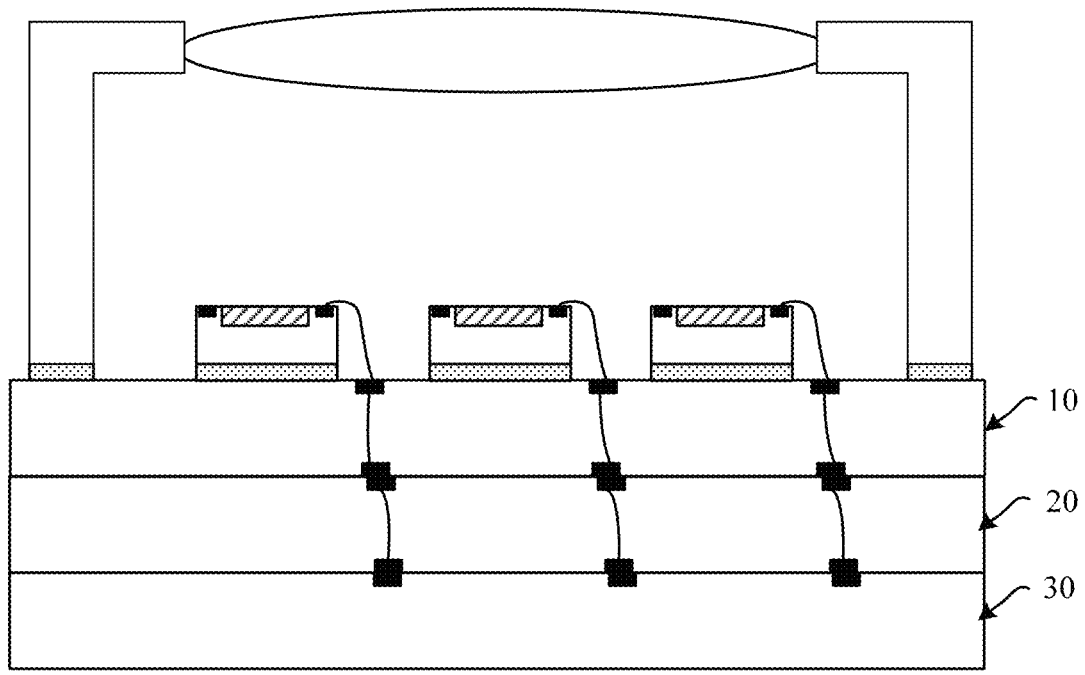
FIG. 1 is a schematic sectional view of a package-on-package structure of an image sensing chip according to the conventional technology.

Reference numbers in the drawings are listed as follows:
  10: image sensing chip package
  11: first substrate
  11a: first surface of the first substrate
  11b: second surface of the first substrate
  111: first contact pad
  112: second contact pad
  113: electrical connection structure connecting the first contact pad to the second contact pad
  114: through hole
  12: image sensing chip
  121: photosensitive region
  122: third contact pad
  13: second wire
  14: plastic packaging material
  15: transparent protective layer
  16: sealed cavity
  17: supporting structure
  18: lens assembly
  181: lens
  182: lens holder
  183: adhesive
  20: control chip package
  21: second substrate
  21a: first surface of the second substrate
  21b: second surface of the second substrate
  I: first region of the first surface of the second substrate
  II: second region of the first surface of the second substrate
  211: fourth contact pad
  212: fifth contact pad
  213: electrical connection structure connecting the fourth contact pad to the fifth contact pad
  22: control chip
  221: sixth contact pad
  23: first wire
  30: circuit board
  40: conductive glue
  41: solder material
  42: solder ball

DETAILED EMBODIMENTS

As described in the background part, in order to achieve the lighting and thinning of an electronic product, it is required to reduce a thickness of a package-on-package structure of an image sensing chip to achieve the miniaturization of an image sensor. In the package-on-package structure of the conventional image sensing chip, the flexible printed circuit (FPC) 30 and the image sensing chip package 10 are respectively arranged on two opposite surfaces of the control chip package 20 to form a vertical stacking structure. A total thickness of the vertical stacking structure may be affected by a thickness of each of the flexible printed circuit (FPC) 30, the control chip package 20 and the image sensing chip package 10, resulting in that the package-on-package structure of the image sensing chip has a relative great thickness.

According to the embodiments of the present disclosure, the number of layers of the package-on-package structure is reduced, such that a total thickness of a package-on-package structure of an image sensing chip is reduced, thereby achieving the miniaturization of an image sensor, thus producing a thin and light electronic product.

In order to reduce the total thickness of the package-on-package structure of the image sensing chip, in the embodiments of the present disclosure, the circuit board is arranged on a lateral side of the image sensing chip package, and the image sensing chip package and the circuit board are located on the same surface of the control chip package, such that the total thickness of the package-on-package structure may not be affected by a thickness of the circuit board, and the total thickness of the package-on-package structure is a sum of thicknesses of the image sensing chip package and the control chip package. Therefore, compared with the package-on-package structure in the conventional technology, the package-on-package structure according to the embodiments of the present disclosure has a smaller thickness, a better flatness and a simpler structure, thereby reducing a process difficulty, thus facilitating the miniaturization of an image sensor.

The embodiments of the present disclosure are described in detail hereinafter in conjunction with the drawings. It is to be understood that the embodiments are not intended to limit the disclosure. Any changes of a structure, a method or a function made by those skilled in the art based on the embodiments should fall within the protection scope of the present disclosure.

In order to make the above object, features and advantages of the present disclosure clearer, embodiments of the present disclosure are described in detail hereinafter in conjunction with the drawings. When describing the embodiments of the present disclosure, sectional views showing a structure of a device may be partially enlarged in accordance with a specific scale for ease of illustration. Moreover, the schematic diagrams are only schematic, which should not be understood as limiting the protection scope of the present disclosure. In addition, three-dimensional spatial sizes of a length, a width and a depth should be included in an actual production.

Figure 2A:
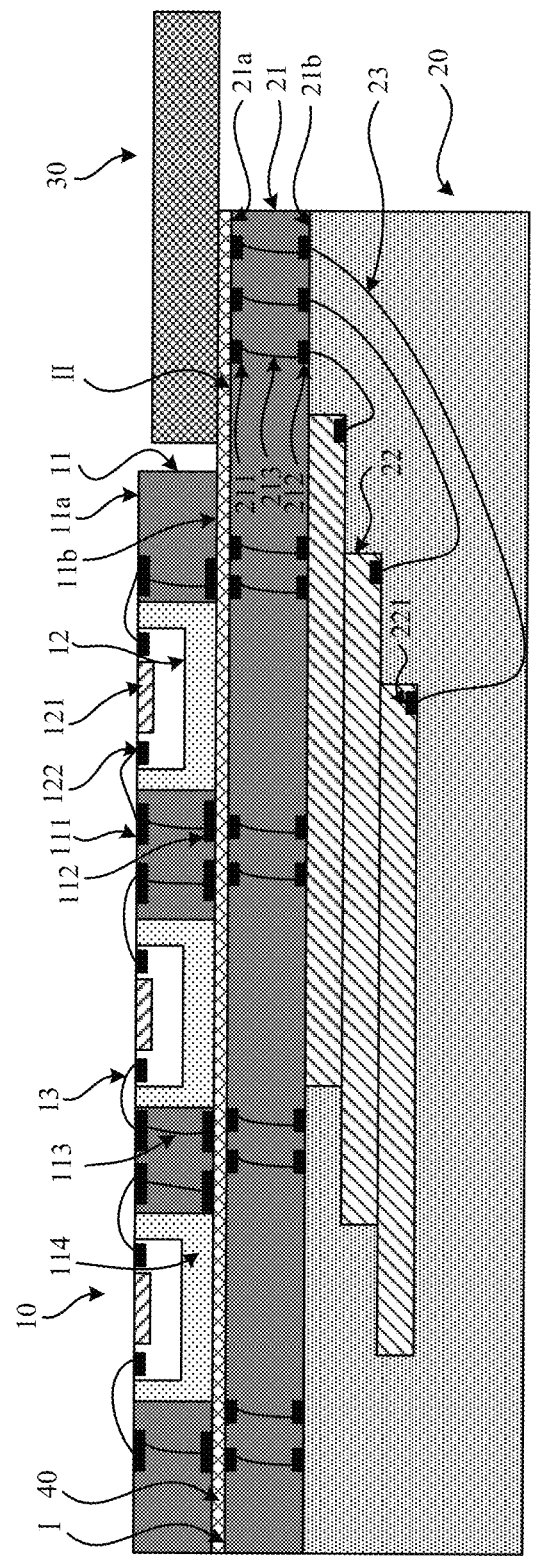
FIGS. 2A to 2E show a schematic sectional view and top views of a package-on-package structure of an image sensing chip according to an embodiment of the present disclosure.

Reference is made to FIG. 2A to FIG. 2E. FIG. 2A is a schematic sectional view of a package-on-package structure of an image sensing chip according to an embodiment of the present disclosure, FIG. 2B to FIG. 2E are top views of a package-on-package structure of an image sensing chip according to an embodiment of the present disclosure. As shown in FIG. 2A to FIG. 2E, the package-on-package structure of the image sensing chip includes an image sensing chip package 10, a control chip package 20 and a circuit board 30.

The image sensing chip package 10 includes a first substrate 11 and an image sensing chip 12. The first substrate 11 includes a first surface 11a and a second surface 11b opposite to each other. The image sensing chip 12 is electrically connected to the first surface 11a of the first substrate. It is to be noted that in the embodiments of the present disclosure, the image sensing chip package 10 includes at least one image sensing chip 12. That is, one or more image sensing chips 12 may be arranged on the first substrate 11. In an embodiment of the present disclosure, the image sensing chip package 10 provided with three image sensing chips 12 is described as an example. In the embodiment of the present disclosure, the first substrate 11 is provided with a through hole 114. The image sensing chip 12 is located in the through hole 114, and a front surface of the image sensing chip 12 is flush with the first surface 11a of the first substrate 11.

Figure 2B:
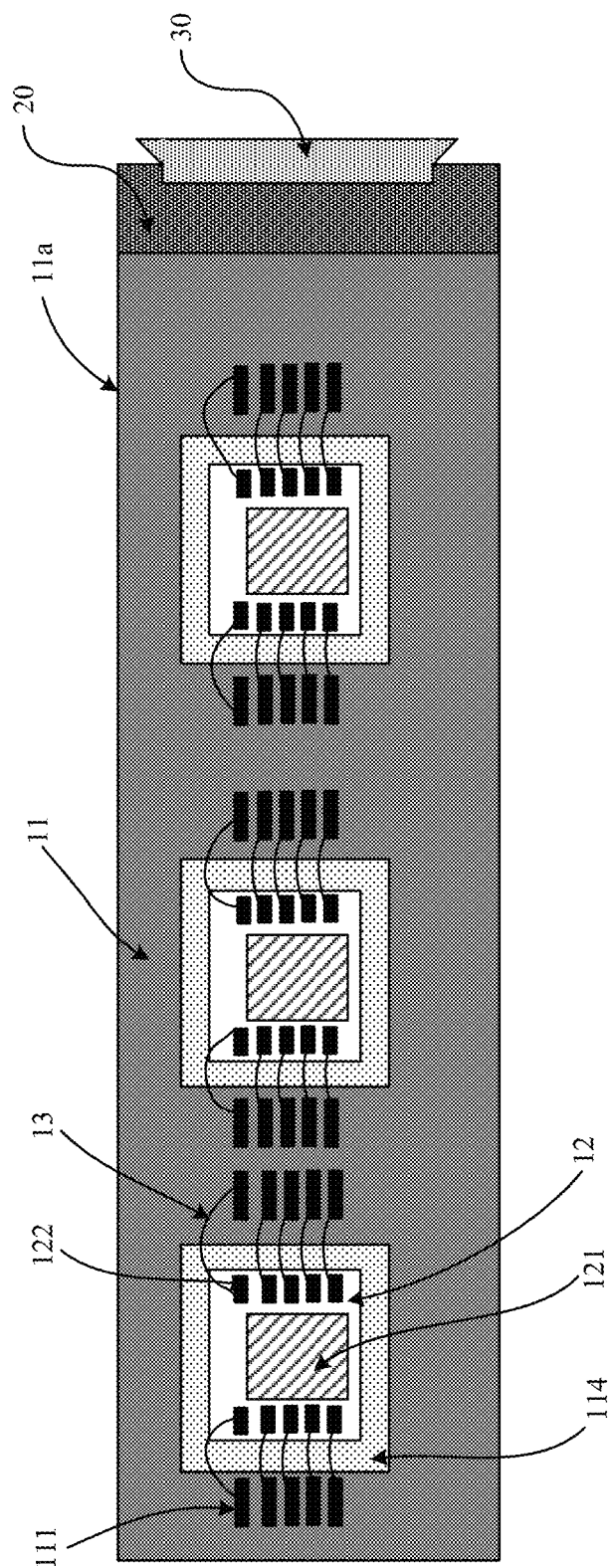
Figure 2C:
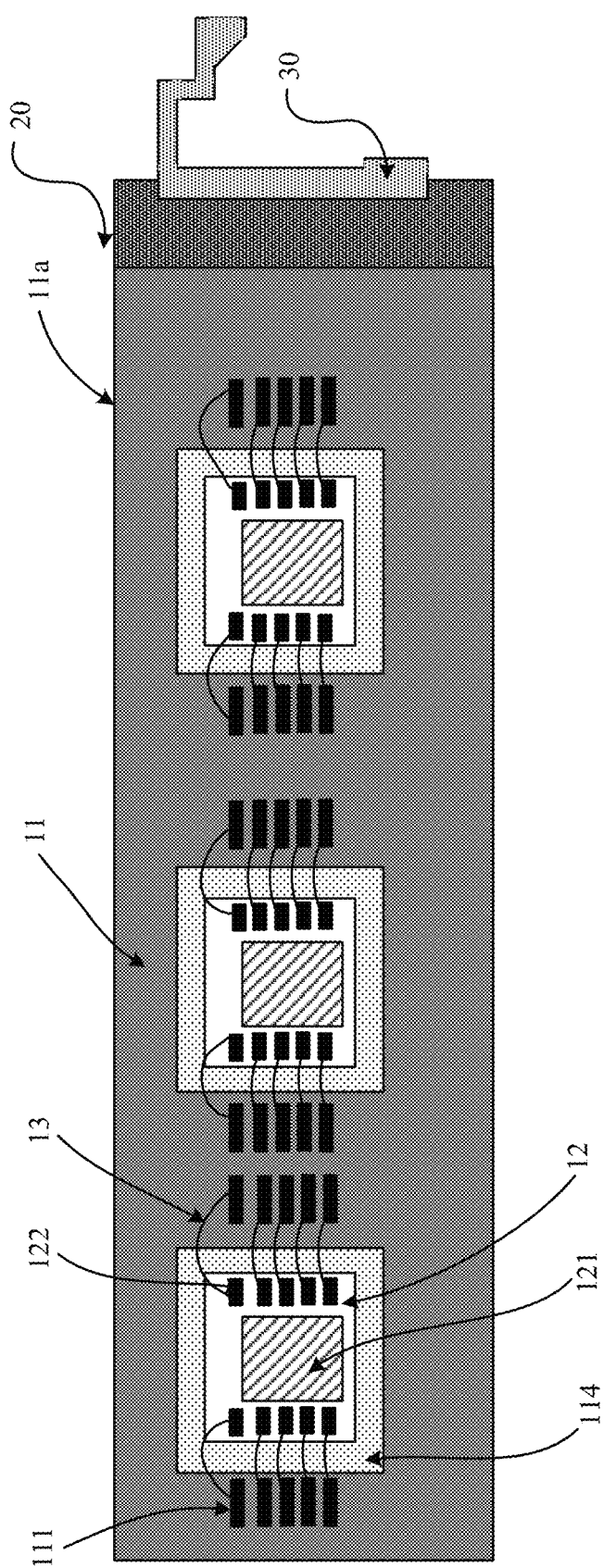
Figure 2D:
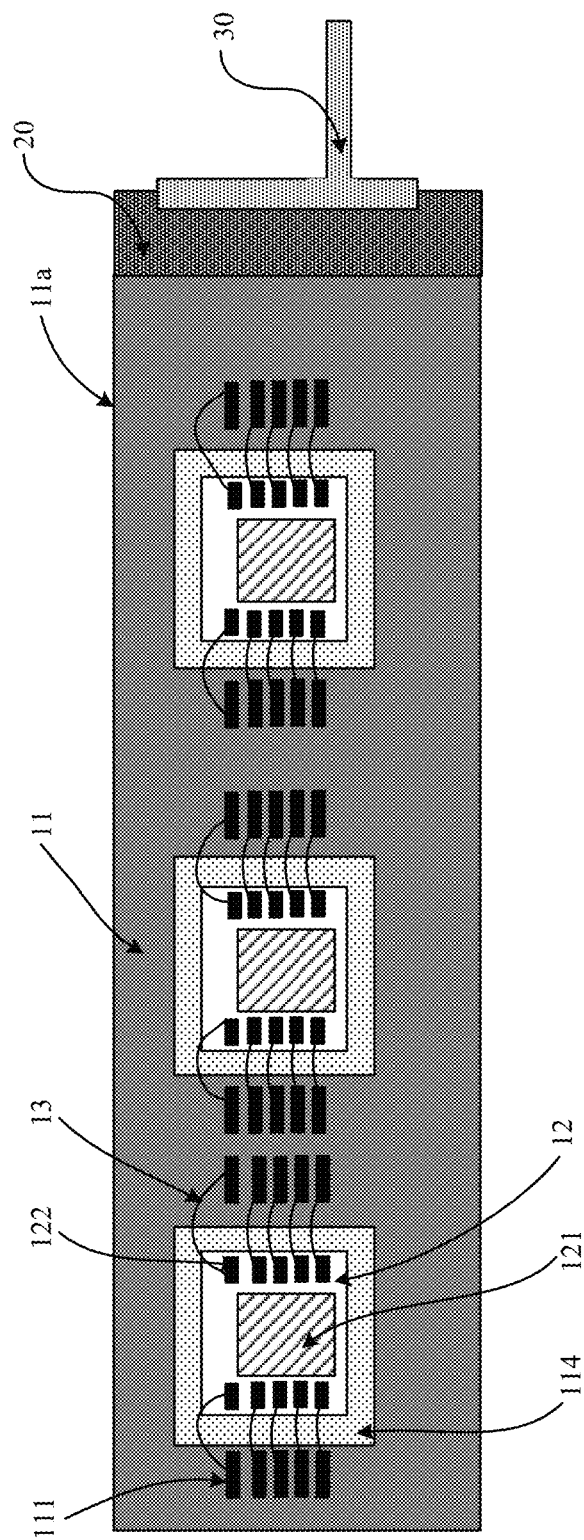

In the package-on-package structure of the image sensing chip according to the embodiment of the present disclosure, one through hole 114 is provided with one image sensing chip 12. The front surface of the image sensing chip 12 is flush with the first surface 11a of the first substrate 11. In this way, it can be ensured that a front surface of each of the image sensing chips 12 is located in the same plane. Corresponding top views of the package-on-package structure are as shown in FIG. 2B to FIG. 2D.

Figure 2E:
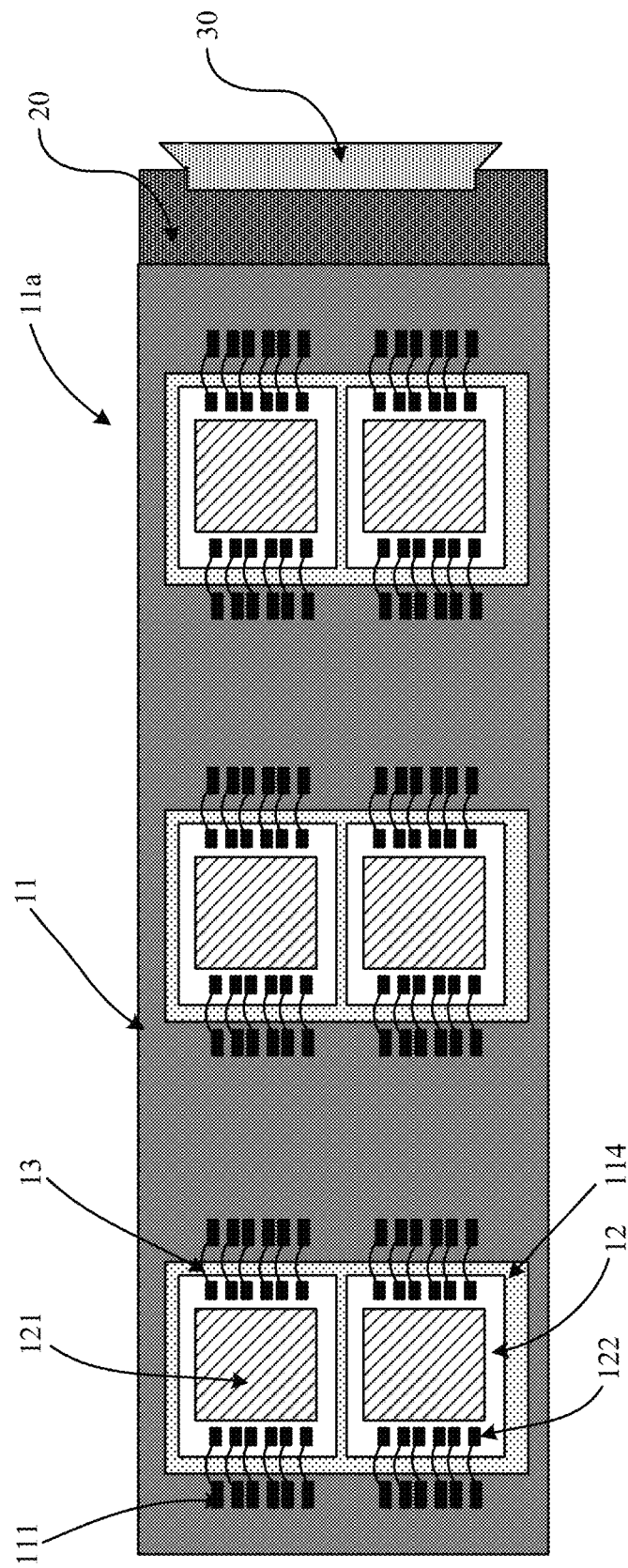

As another embodiment of the present disclosure, one through hole 114 may be provided with multiple image sensing chips 12. A front surface of each of the image sensing chips 12 is flush with the first surface 11a of the first substrate 11. In this way, it can be ensured that the front surface of each of the image sensing chips 12 is located in the same plane. A corresponding top view of the package-on-package structure is as shown in FIG. 2E.

In a case where a thickness of the image sensing chip 12 is less than a thickness of the first substrate 11, there is a difference between heights of a back surface of the image sensing chip 12 and the second surface 11b of the first substrate 11. In order to compensate the difference, a space in the through hole 114 unoccupied by the image sensing chip 12 may be filled with a plastic packaging material.

The control chip package 20 includes a second substrate 21 and at least one control chip 22. The second substrate 21 includes a first surface 21a and a second surface 21b opposite to each other. The first surface 21a of the second substrate includes a first region I and a second region II. The control chip 22 is located on the second surface 21b of the second substrate and is electrically connected to the second surface 21b of the second substrate. The image sensing chip package 10 and the circuit board 30 are located on the first surface 21a of the second substrate 21. The circuit board 30 is located at a lateral side of the image sensing chip package 10. The second surface 11b of the first substrate 11 is electrically connected to the first region I of the first surface 21a of the second substrate 21. The circuit board 30 is electrically connected to the second region II of the first surface 21a of the second substrate 21. The circuit board 30 may extend outside the second region II.

The first surface 11a and the second surface 11b of the first substrate are respectively provided with first contact pads 111 and second contact pads 112. Electrical connection structures 113 are arranged inside the first substrate 11, and each of the electrical connection structures 113 is configured to achieve an electrical connection between the first contact pad 111 and the second contact pad 112. The front surface of the image sensing chip 12 is provided with a photosensitive region 121 and third contact pads 122 located outside the photosensitive region. The image sensing chip 12 being electrically connected to the first surface 11a of the first substrate may include: electrically connecting the third contact pad 122 on the image sensing chip to the first contact pad 111 through a second wire 13.

The first surface 21a and the second surface 21b of the second substrate 21 are respectively provided with fourth contact pads 211 and fifth contact pads 212. Electrical connection structures 213 are arranged inside the second substrate 21. The control chip 22 may be arranged on the second surface 21b of the second substrate 21 in a flip-chip manner. The control chip package 20 may include one or more control chips 22. In a case where the control chip package 20 includes multiple control chips 22, the multiple control chips may form a vertical stacking structure.

In a case where the multiple control chips form the vertical stacking structure, in order to facilitate the electrical connection between each of the control chips 22 and the second surface 21b of the second substrate 21, surfaces of adjacent control chips 22 are not overlapped completely with each other. That is, surfaces of adjacent control chips 22 are overlapped partially with each other to reserve a position for electrical connection through a wire.

As an example of the present disclosure, a region on the control chip 22 that is not covered by an adjacent control chip is provided with a sixth contact pad 221. The sixth contact pad 221 on the control chip 22 is electrically connected to the fifth contact pad on the second surface 21b of the second substrate 21 through the first wire 23.

The control chip 22 is configured to control the image sensor chip 12. The function of the control chip 22 is not limited herein, as long as an electric signal is transmitted between the control chip 22 and the image sensor chip 12, that is, the "control" herein can be achieved. The control chip 22 is arranged corresponding to at least one image sensing chip 12. That is, the control chip 22 is configured to control at least one image sensor chip 12. In addition, in order to simplify a circuit design of the control chip 22, as an example of the present disclosure, there is a one-to-one correspondence between the control chips 22 and the image sensing chips 12. That is, one control chip 22 only controls one image sensing chip 12.

As an example, the control chip 22 may be an application specific integrated circuit (ASIC) chip.

In the embodiment of the present disclosure, the second surface 11b of the first substrate 11 is adhered to the first region I of the first surface 21a of the second substrate 21 through conductive glue 40. A back surface of the circuit board 30 is adhered to the second region II of the first surface 21a of the second substrate 21 through the conductive glue 40. As an example of the present disclosure, the conductive glue 40 may be anisotropic conductive glue. It is to be noted that the conductive glue 40 may be applied on at least one of the two surfaces to be electrically connected with each other. Specifically, in order to electrically connect the second surface 11b of the first substrate 11 to the first region I of the first surface 21a of the second substrate 21, the second surface 11b of the first substrate 11 may be coated with the conductive glue 40, the first region I of the first surface 21a of the second substrate 21 may be coated with the conductive glue 40, or both the second surface 11b of the first substrate 11 and the first region I of the first surface 21a of the second substrate 21 may be coated with the conductive glue 40. In order to electrically connect the circuit board 30 to the second region II of the first surface 21a of the second substrate 21, the back surface of the circuit board 30 may be coated with the conductive glue 40, the second region II of the first surface 21a of the second substrate 21 may be coated with the conductive glue 40, or both the back surface of the circuit board 30 and the second region II of the first surface 21a of the second substrate 21 may be coated with the conductive glue 40.

In this way, signal transmission is achieved among the circuit board 30, the control chip 22 and the image sensing chip 12 by the fourth contact pad 211, the fifth contact pad 212 and the sixth contact pad 221 electrically connected to each other, the first contact pad 111, the second contact pad 112 and the third contact pad 122 electrically connected to each other, and the conductive glue 40.

The circuit board 30 may be a flexible printed circuit (FPC), and a shape of the circuit board 30 may be matched with a shape of the second region II. As an example of the present disclosure, FIG. 2B to FIG. 2D show top views of a package-on-package structure of an image sensing chip. It can be known from FIG. 2B to FIG. 2D that, the circuit board may have a long strip shape or a trapezoid-like shape, and the shape of the circuit board may be determined according to actual needs and is not be limited in the embodiments of the present disclosure.

Figure 3:
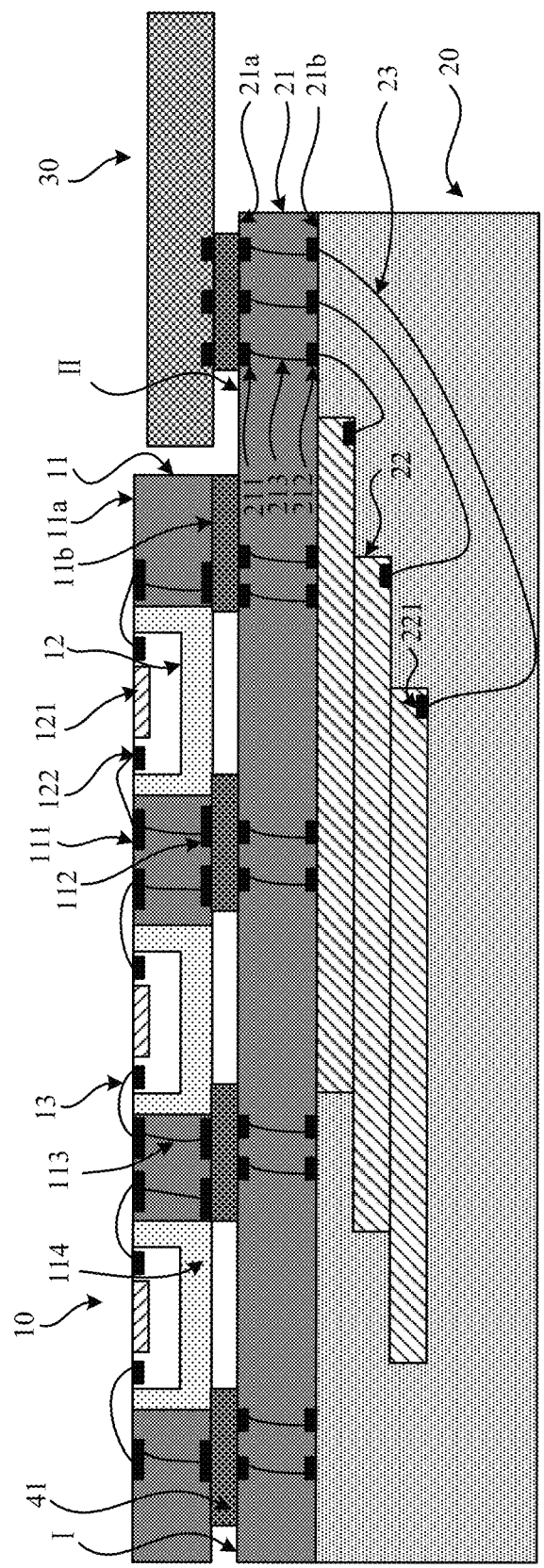
FIG. 3 is a schematic sectional view of a package-on-package structure of an image sensing chip according to another embodiment of the present disclosure.

As another example of the present disclosure, in order to achieve the signal transmission, except the manner of using the conductive glue 40, the electrical connection may also be achieved in a metal bonding manner. As shown in FIG. 3, the second surface 11b of the first substrate 11 is electrically connected to the first region I of the first surface 21a of the second substrate 21 in the metal bonding manner, and the back surface of the circuit board is electrically connected to the second region II of the first surface of the second substrate in the metal bonding manner. Specifically, the first surface 21a of the second substrate 21 may be coated with a metal solder material 41, and the second surface 11b of the first substrate 11 is soldered with the first region I of the first surface 21a of the second substrate 21 through the metal solder material 41. As another example, the second surface 11b of the first substrate 21 and the back surface of the circuit board 30 may be coated with the metal solder material 41, to achieve an electrical connection between the second surface 11b of the first substrate 11 and the first region I of the first surface 21a of the second substrate 21 and an electrical connection between the circuit board 30 and the second region II of the first surface 21a of the second substrate 21. As another example, the two surfaces to be electrically connected with each other may be coated with the metal solder material. That is, the second surface 11b of the first substrate 21, the back surface of the circuit board 30, the second surface 11b, the first region I and the second region II of the first surface 21a of the second substrate 21 are all coated with the metal solder material.

Figure 4:
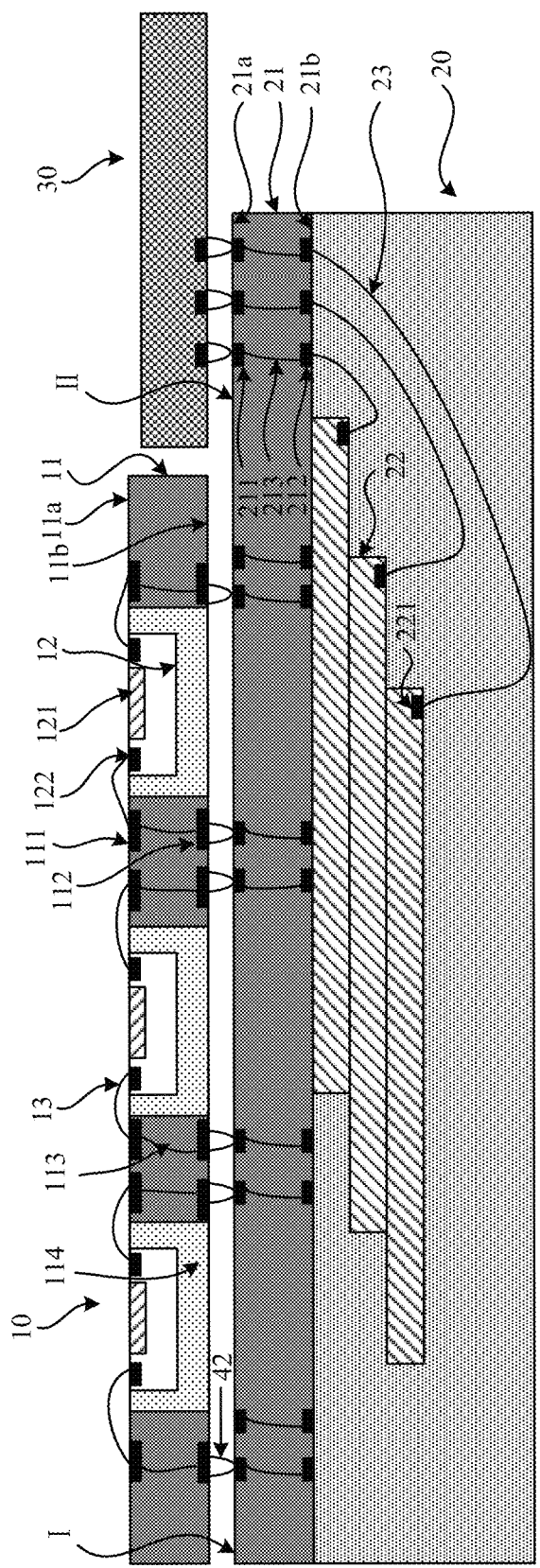
FIG. 4 is a schematic sectional view of a package-on-package structure of an image sensing chip according to another embodiment of the present disclosure.

As another example of the present disclosure, in order to achieve the signal transmission, except the manner of using the conductive glue 40, the electrical connection may also be achieved through metal solder balls 42. As shown in FIG. 4, the second surface 11b of the first substrate 11 and the back surface of the circuit board 30 are provided with metal solder balls 42. The second surface 11b of the first substrate 11 is electrically connected to the first region I of the first surface 21a of the second substrate 21 through the metal solder balls 42, and the back surface of the circuit board 30 is connected to the second region II of the first surface 21a of the second substrate 21 through the metal solder balls. As another example, the first region I and the second region II of the first surface 21a of the second substrate 21 may be respectively provided with the metal solder balls 42, to achieve the electrical connection between the second surface 11b of the first substrate 11 and the first region I of the first surface 21a of the second substrate 21 and the electrical connection between the circuit board 30 and the second region II of the first surface 21a of the second substrate 21. As another example, the two surfaces to be connected with each other may be respectively provided with the metal solder balls 42. That is, the second surface 11b of the first substrate 21, the back surface of the circuit board 30, the second surface 11b, the first region I and the second region II of the first surface 21a of the second substrate 21 are all provided with the metal solder balls 42.

In the above embodiments, the first substrate 11 is provided with the through hole 114. The image sensing chip 12 is located in the through hole 114, and the front surface of the image sensing chip 12 is flush with the first surface 11a of the first substrate 11. Since the height of the image sensing chip 12 is controlled using the first surface 11a of the first substrate 11 as a reference, and the first surface 11a of the first substrate 11 does not change during a packaging process, in the package-on-package structure, there is almost no uncontrollable factor affecting the height of image sensing chip 12. Therefore, with the package-on-package structure, the height of the image sensing chip 12 can be accurately controlled, to reduce a difference between an actual height and a designed height of the image sensing chip 12, such that the actual height of the image sensing chip 12 is basically the same as the designed height. Therefore, with the implementation, the difference between the actual height of the image sensing chip 12 and the designed height of the image sensing chip 12 can be reduced, thereby strictly controlling the height of the image sensing chip 12, thus improving the imaging quality of an image sensor.

Figure 5:
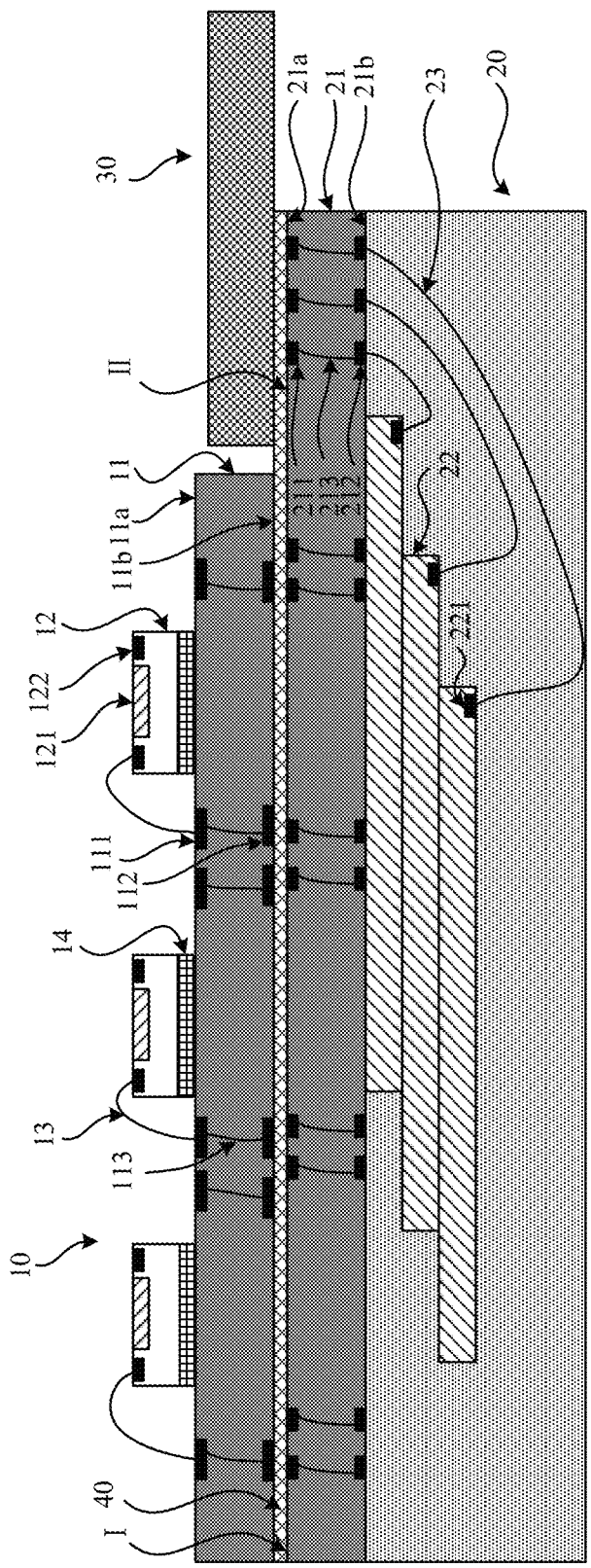
FIG. 5 is a schematic sectional view of a package-on-package structure of an image sensing chip according to another embodiment of the present disclosure.

In addition, as another example of the present disclosure, the image sensing chip 12 may also be located on the first surface 11a of the first substrate 11. As shown in FIG. 5, the image sensing chip 12 is located on the first surface 11a of the first substrate 11, and the image sensing chip 12 is adhered to the first surface 11a of the first substrate 11 through an adhesive 183.

It is to be noted that the above described is an example of a structure in which the image sensing chip 12 is arranged on the first surface 11a of the first substrate 11 changed based on the package-on-package structure shown in FIG. 2A in which the image sensing chip 12 is arranged in the first substrate 11. As an extension of the embodiment of the present disclosure, the image sensing chip 12 may also be arranged on the first surface 11a of the first substrate 11 in the package-on-package structure shown in FIG. 3 or FIG. 4. Based on the disclosed implementation of changing the position of the image sensing chip 12 on the basis of the package-on-package structure shown in FIG. 2A, it is readily conceived by those skilled in the art of an implementation of a package-on-package structure in which the image sensing chip is arranged on the first surface 11a of the first substrate 11 on the basis of the package-on-package structure in any one of examples shown in FIG. 3 to FIG. 4. For the sake of brevity, the implementation is not repeated herein.

Figure 6:
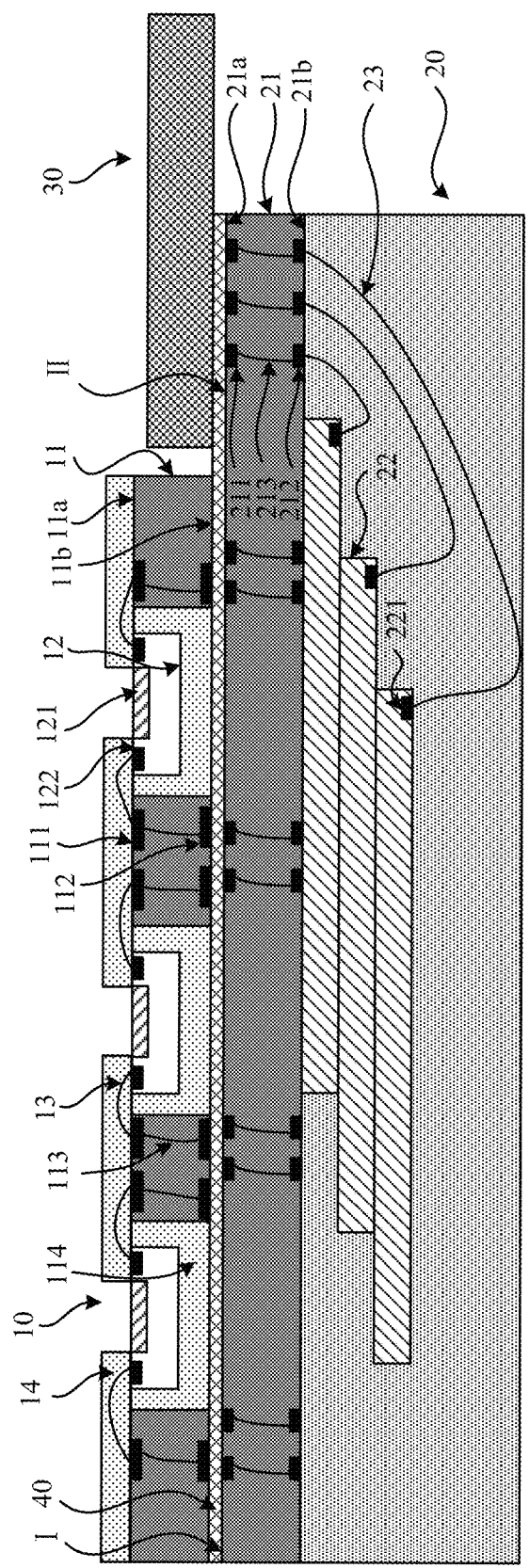
FIG. 6 is a schematic sectional view of a package-on-package structure of an image sensing chip according to another embodiment of the present disclosure.

As another example of the present disclosure, on the basis of the package-on-package structure shown in any one of the above examples, in order to prevent the second wire 13 from being scratched, as shown in FIG. 6, the second wire 13 may be cladded with the plastic packaging material 14. In order to clad the second wire 13 with the plastic packaging material 14, the first surface 11a of the first substrate 11 and a region on the front surface of the image sensing chip 12 other than the photosensitive region are all cladded with the plastic packaging material, to form a plastic packaging structure.

Figure 7:
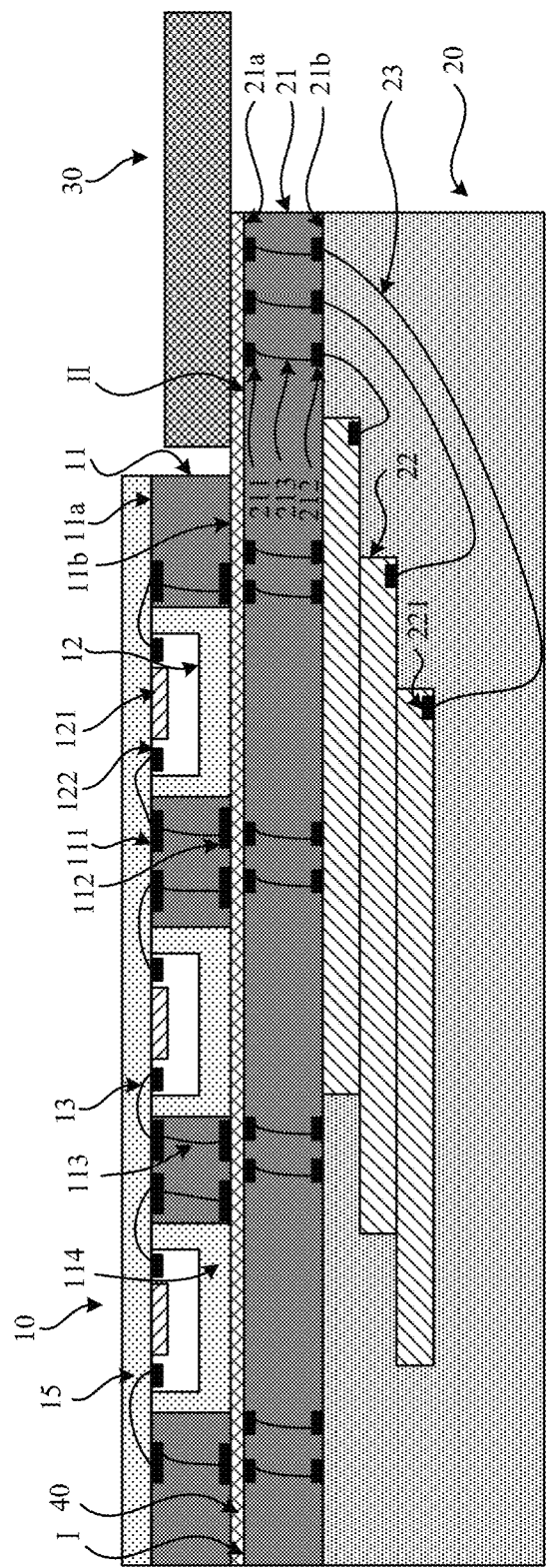
FIG. 7 is a schematic sectional view of a package-on-package structure of an image sensing chip according to another embodiment of the present disclosure.

In addition, as another optional embodiment of the present disclosure, in order to prevent the photosensitive region 121 from being contaminated by an external environment, as shown in FIG. 7, on the basis of the package-on-package structure shown in any one of the above examples, a transparent protective layer 15 may further be arranged above the first surface 11a of the first substrate 11 to protect the photosensitive region 121. The transparent protective layer 15 may be an anti-reflective glass layer. In addition, the transparent protective layer 15 may also be a plastic film layer.

It is to be noted that the package-on-package structure shown in FIG. 7 is a structure improved based on the above package-on-package structure shown in FIG. 2A. As an extension of the embodiment of the present disclosure, the transparent protective layer 15 may be additionally arranged in any one of the package-on-package structures shown in FIG. 3 to FIG. 6, to prevent the photosensitive region 121 from being contaminated by an external environment.

It is to be noted that, in a case where the transparent protective layer 15 is made of a transparent material, the lens assembly may be directly assembled on the transparent protective layer 15, or may be assembled on the first surface 11a of the first substrate 11 after the transparent protective layer 15 is removed. In addition, with the process of assembling the lens assembly after the transparent protective layer 15 is removed, the formed image sensor may not generate optical phenomena such as chromatic aberration or a ghost image, thereby facilitating the improvement of the imaging quality of the image sensor.

Figure 8:
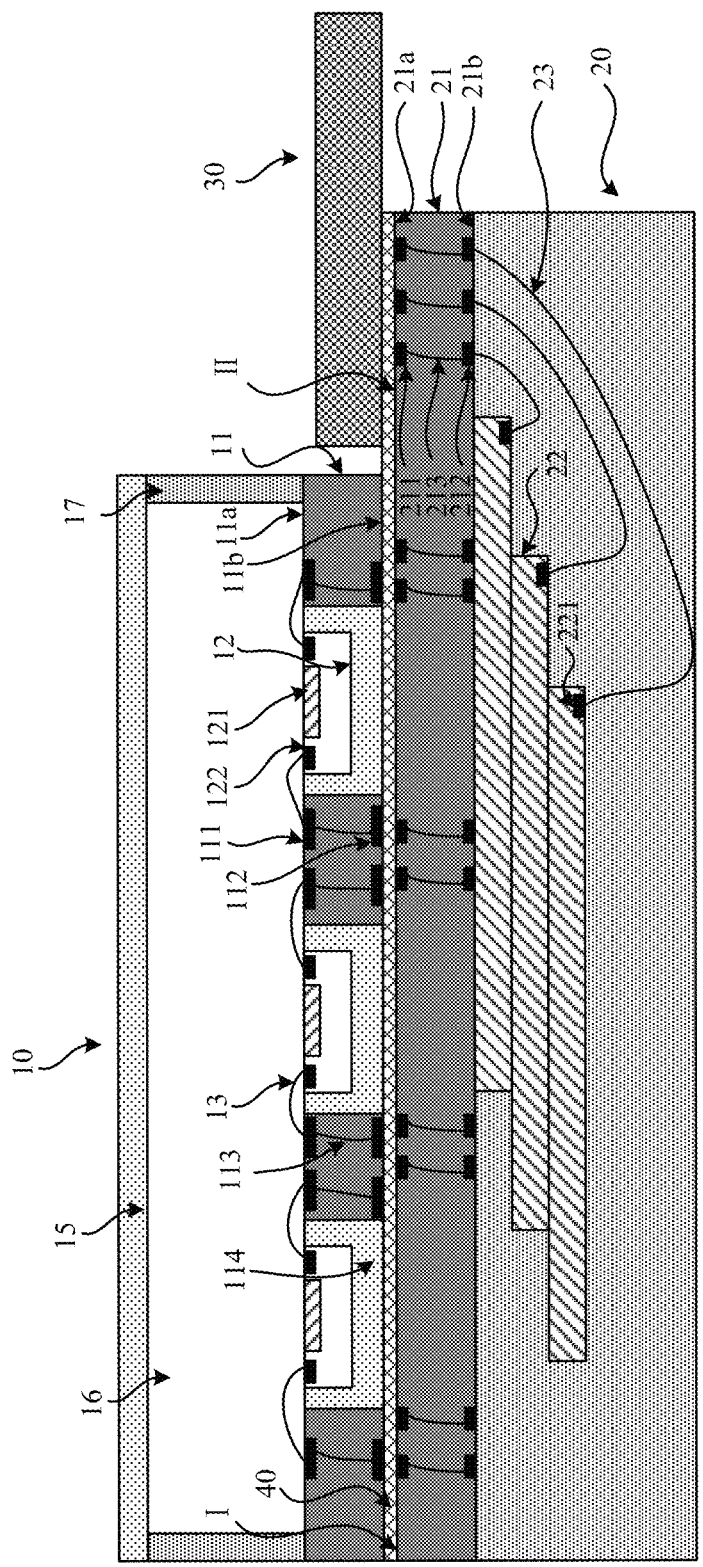
FIG. 8 is a schematic sectional view of a package-on-package structure of an image sensing chip according to another embodiment of the present disclosure.

As an example of the present disclosure, the transparent protective layer 15 may be immediately adjacent to the first surface 21a of the substrate 21, and a corresponding sectional view of the structure is as shown in FIG. 7. As another example of the present disclosure, as shown in FIG. 8, there is a certain distance between the transparent protective layer 15 and the first surface 11a of the first substrate 11, such that a sealed cavity 16 is formed between the transparent protective layer 15 and the image sensing chip 12. The photosensitive region 121 is located in the sealed cavity 16, such that the photosensitive region 121 can be prevented from being contaminated by an external environment. As an embodiment of the present disclosure, in order to form the sealed cavity 16 between the transparent protective layer 15 and the image sensing chip 12, a supporting structure 17 for supporting the transparent protective layer 15 is formed on the first surface 11a of the first substrate 11. The supporting structure 17 is located between the transparent protective layer 15 and the image sensing chip 12, and the sealed cavity 16 is formed by surrounding by the supporting structure 17, the transparent protective layer 15 and the image sensing chip 12.

In the embodiment of the present disclosure, the supporting structure 17 may be made of photosensitive glue and formed on the first surface 11a of the first substrate 11 with an exposing and developing process.

In other embodiments, the first surface 11a of the first substrate 11 may be further provided with other devices, such as a resistor, an inductor, a capacitor, an integrated circuit block and an optical component. The type of the device may be determined based on the types of the substrate and the image sending chip.

In the implementations of the package-on-package structure shown in FIG. 2A to FIG. 8, the first surface 11a of the first substrate 11 is provided with no lens assembly. In order to produce an image device, it is required to assemble the lens assembly above the first surface 11a of the first substrate 11, and locate the lens of the lens assembly at a position opposite to the photosensitive region 121 of the image sensing chip 12 during a process of producing the image device.

As another implementation of the present disclosure, the lens assembly may be arranged above the first surface 11a of the substrate. The corresponding sectional view of the structure corresponding to the implementation is as shown in FIG. 9.

Figure 9:
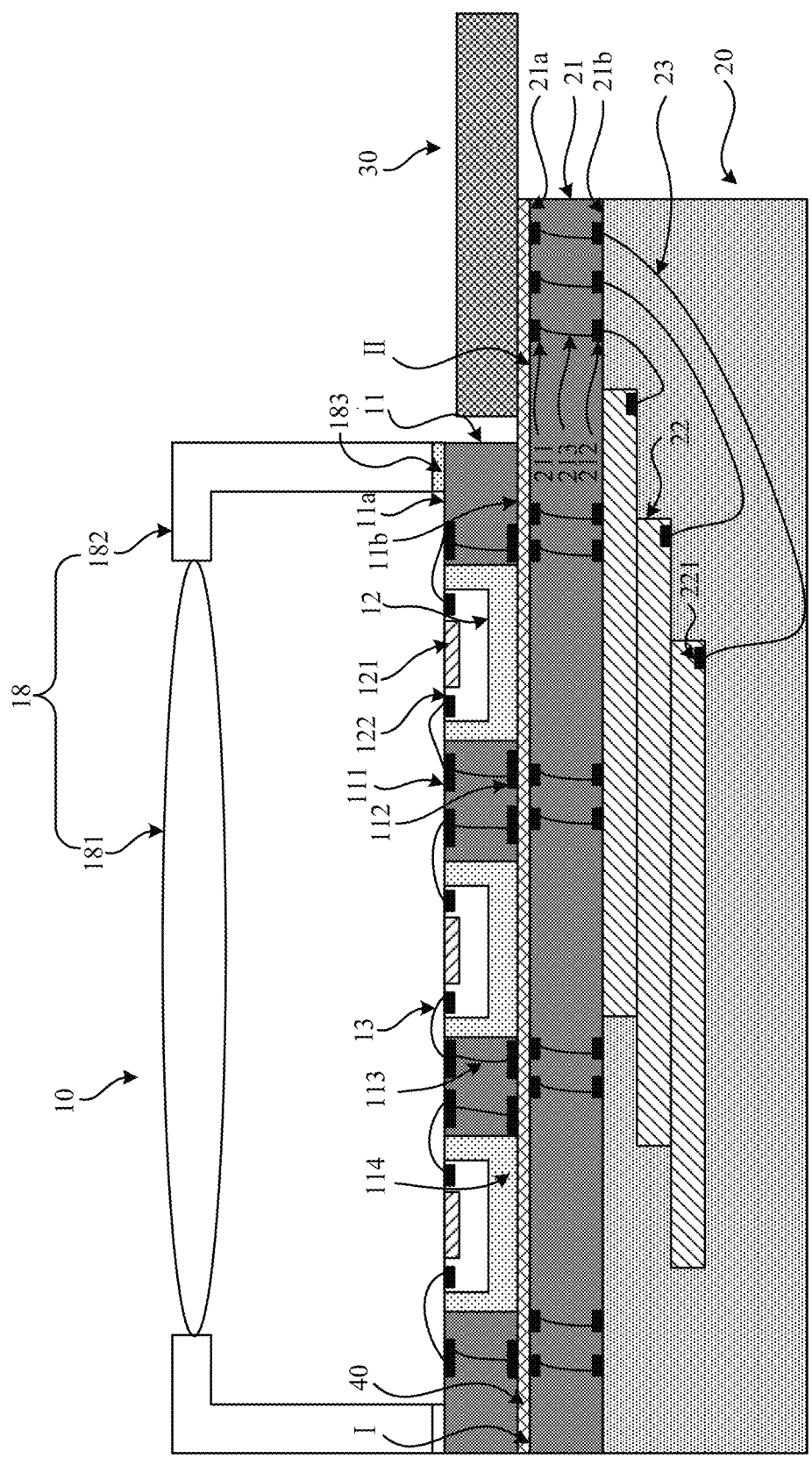
FIG. 9 is a schematic sectional view of a package-on-package structure of an image sensing chip according to another embodiment of the present disclosure.

It is to be noted that, FIG. 9 shows a package-on-package structure of an image sensing chip improved based on the package-on-package structure of the image sensing chip shown in FIG. 2A, and there are multiple similarities between the package-on-package structure of the image sensing chip shown in FIG. 9 and the package-on-package structure of the image sensing chip shown in FIG. 2A. For the sake of brevity, only the differences are emphasized herein and the similarities may be seen in the related description of FIG. 2A.

In addition to the components shown in FIG. 2A, the package-on-package structure of the image sensing chip shown in FIG. 9 may further include a lens assembly 18 arranged above the first surface 11a of the first substrate 11.

The lens assembly 18 includes a lens 181 and a lens holder 182. The lens holder 182 is fixedly connected to the first surface 11a of the first substrate 11. As an example, the lens holder 182 may be adhered to the first surface 11a of the first substrate 11 through the adhesive 183. In order to allow the photosensitive region 121 to sensing light passing through the lens 181 easily, as an example, the lens 181 may be located opposite to the photosensitive region 121 of the image sensing chip 12. In addition, as an example, the lens 181 may be arranged corresponding to one image sensing chip 12, or the lens 181 may be arranged corresponding to multiple image sensing chips 12.

In the embodiment of the present disclosure, there is a certain space between the first substrate 11 and the lens 181.

Therefore, other devices may also be arranged at a position on the first surface 11a between the lens 181 and the first substrate 11, and the devices may form a stacking structure with a high density between the lens 181 and the first substrate 11, thereby facilitating the miniaturization of the package. Furthermore, an optical component, such as a polarizer and an infrared filter, may be further provided between the lens 181 and the first surface 11a of the first substrate 11, thereby improving the imaging quality of the image sensor.

It is to be noted that the above described is an example of a structure in which a lens assembly is additionally arranged improved based on the package-on-package structure shown in FIG. 2A. As an extension of the embodiment of the present disclosure, the lens assembly may be additionally arranged on the package-on-package structure in any one of examples shown in FIG. 3 to FIG. 8. Based on the disclosed implementation of additionally arranging the lens assembly on the package-on-package structure shown in FIG. 2A, it is readily conceived by those skilled in the art of an implementation of a package-on-package structure in which the lens assembly is additionally arranged in the package-on-package structure in any one of the above examples shown in FIG. 3 to FIG. 8. For the sake of brevity, the specific implementation is not repeated herein.

In the above implementation in which the lens assembly is arranged, the package-on-package structure of the image sensing chip includes the lens assembly. In this way, it is unnecessary to additionally assemble the lens assembly during a process of assembling the image sensor, thereby simplifying the process of assembling the image sensor.

The implementations of the package-on-package of the image sensing chip according to the embodiment of the present disclosure are described above. In the above implementations, the image sensing chip package 10 and the circuit board 30 are located on the same surface of the control chip package 20, and the circuit board 30 is located at a lateral side of the image sensing chip package 10, such that the total thickness of the package-on-package structure is not be affected by the thickness of the circuit board 30, and the total thickness of the package-on-package structure is a sum of thicknesses of the image sensing chip package 10 and the control chip package 20. Therefore, compared with the package-on-package structure in the conventional technology, the package-on-package structure according to the embodiments of the present disclosure has a smaller thickness, a better flatness and a simpler structure, thereby reducing a process difficulty, thus facilitating the miniaturization of an image sensor.

The implementations of the image sensing chip packaging structure according to the embodiments of the present disclosure are described above. Based on the implementations, implementations of a package-on-package method of an image sensing chip are further provided according to the embodiments of the present disclosure.

As shown in FIG. 10, the package-on-package method for the image sensing chip according to an embodiment of the present disclosure includes the following steps S1001 to S1003.

In step S1001, an image sensing chip package 10, a control chip package 20 and a circuit board 30 are provided. The image sensing chip package 10 includes a first substrate 11 and an image sensing chip 12. The first substrate 11 includes a first surface 11a and a second surface 11b opposite to each other. The image sensing chip 12 is electrically connected to the first surface 11a of the first substrate 11. The control chip package 20 includes a second substrate 21 and a control chip 22. The second substrate 21 includes a first surface 21a and a second surface 21b opposite to each other. The first surface 21a of the second substrate 21 includes a first region I and a second region II. The control chip 22 is located on the second surface 21b of the second substrate 21, and is electrically connected to the second surface 21b of the second substrate 21.

The image sensing chip package 10 includes the first substrate 11 and at least one image sensing chip 12. The first substrate 11 includes a first surface 11a and a second surface 11b opposite to each other. As an example, the first substrate 11 may be a printed circuit board, that is, a PCB panel. The control chip package 20 includes a second substrate 21 and a control chip 22. The control chip 22 may be an application specific integrated circuit (ASIC) chip, and the number of the control chips may be more than one. The control chip 22 may be arranged corresponding to at least one image sensing chip 12. Similarly, the second substrate 21 includes the first surface 21a and the second surface 21b opposite to each other, and the second substrate may also be a printed circuit board (PCB).

The first surface 11a of the first substrate 11 is provided with first contact pads 111. The second surface 11b of the first substrate 11 is provided with second contact pads 112. The second contact pad 112 is configured to achieve an electrical connection between the first substrate 11 and the control chip 22.

Figure 11A:
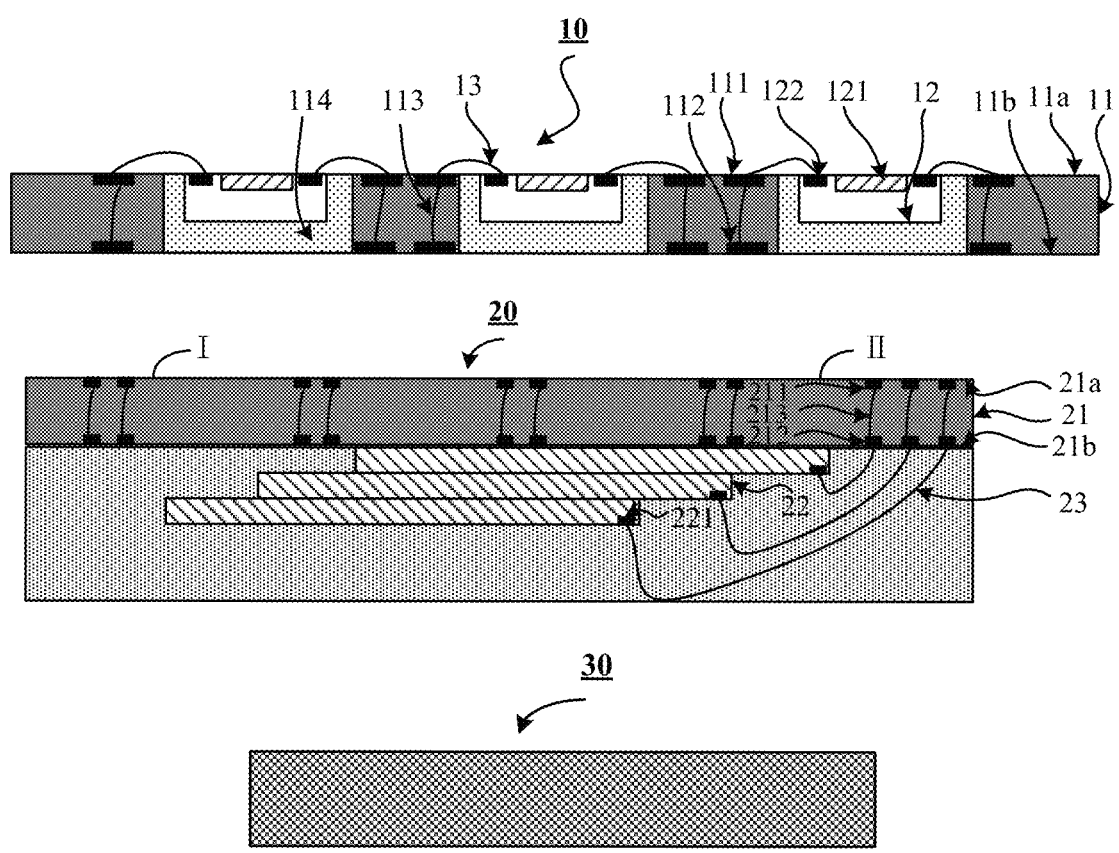
FIGS. 11A and 11B are schematic sectional views of structures corresponding to a series of steps of a package-on-package method for a package-on-package structure of an image sensing chip according to an embodiment of the present disclosure.

A corresponding sectional view of the structure after step S1001 is completed may be as shown in FIG. 11A.

In step S1002, the first region I and the second region II of the first surface 21a of the second substrate 21 are coated with conductive glue 40.

In step S1002, the conductive glue 40 may be continuous, and may be applied on the whole first surface 21b of the second substrate 21. In this way, the first region I and the second region II of the second substrate 21 are all coated with the conductive glue 40. As another example of the present disclosure, the conductive glue 40 applied on the first surface 21a of the second substrate 21 may also be discontinuous, and the conductive glue 40 may be applied on a position on each of the first region and the second region where an electrical connection is required to be formed.

Figure 11B:
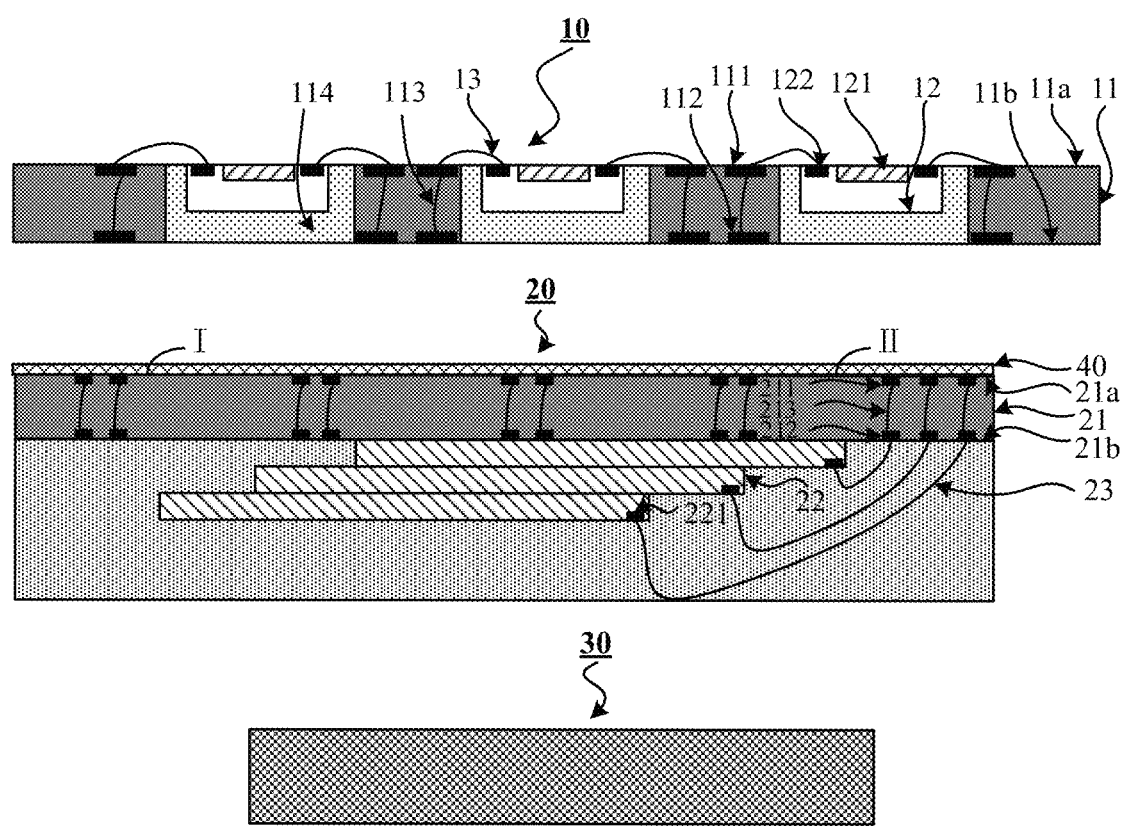

A corresponding sectional view of the structure after step S1002 is completed may be as shown in FIG. 11B.

In step S1003, the image sensing chip package 10 and the circuit board 30 are arranged on the first surface 21a of the second substrate 21 in parallel. The first region I is electrically connected to the second surface 11b of the first substrate 11 through the conductive glue 40, and the second region II is electrically connected to the circuit board 30 through the conductive glue 40.

In step S1003, the second surface 11b of the first substrate 11 may be aligned with the first region I coated with the conductive glue 40, and the second surface 11b of the first substrate 11 is attached to the first region I, to achieve the electrical connection between the first region I and the second surface 11b of the first substrate 11. Similarly, a back surface of the circuit board 30 is aligned with the second region II coated with the conductive glue 40, and the back surface of the circuit board 30 is attached to the second region II, to achieve the electrical connection between the second region II and the circuit board 30.

The image sensing chip package and the circuit board 30 are arranged on the same surface of the second substrate 21 in parallel, to reduce the number of layers of the package-on-package structure by one, thereby reducing a total thickness of the package-on-package structure. The first region I may be electrically connected to the second surface 11b of the first substrate 11 through the conductive glue 40, and the second region II may be electrically connected to the circuit board 30 through the conductive glue 40, such that signal transmission among the circuit board 30, the control chip 22 and the image sensing chip 12 can be achieved.

A corresponding sectional view of the structure after step S1003 is completed may be as shown in FIG. 2A.

In the above embodiment, the first region I and the second region II of the first surface 21a of the second substrate 21 are all coated with the conductive glue 40, to achieve the electrical connection between the first region I and the second surface 11b of the first substrate 11, and the electrical connection between the second region II and the circuit board 30. As an extension of the embodiment of the present disclosure, the second surface 11b of the first substrate and the back surface of the circuit board 30 may be coated with the conductive glue 40, or the second surface 11b of the first substrate 11, the first region I, the back surface of the circuit board 30 and the second region II may be coated with the conductive glue 40, to adhere the second surface 11b of the first substrate 11 to the first region I of the first surface 21a of the second substrate 21 through the conductive glue 40 and to adhere the back surface of the circuit board 30 to the second region II of the first surface 21a of the second substrate 21 through the conductive glue 40.

The conductive glue 40 is used to achieve the electrical connection between two surfaces. As an extension of the embodiment of the present disclosure, it is readily conceived by those skilled in the art of an implementation of achieving the electrical connection between the two surfaces through a metal solder material 41 or metal solder balls 42 instead of the conductive glue 40. The electrical connection between the first region I and the second surface 11b of the first substrate 11 is achieved through the metal solder material 41 or the metal solder balls 42. A process of electrically connecting the second region II to the circuit board 30 is similar to that in the embodiment in which the electrical connection is achieved through the conductive glue 40, and reference may be made to the above embodiments.

The second surface 11b of the first substrate 11 is soldered with the first region I of the first surface 21a of the second substrate 21 through the metal solder material 41 with a metal bonding process, and the back surface of the circuit board 30 is sodered with the second region II of the first surface 21a of the second substrate 21 through the metal solder material 41 with the metal bonding process, a sectional view of a structure thus obtained is as shown in FIG. 3.

The second surface 11b of the first substrate 11 is soldered with the first region I of the first surface 21a of the second substrate 21 through the metal solder balls 42 with a soldering process, and the back surface of the circuit board 30 is soldered with the second region II of the first surface 21a of the second substrate 21 through the metal solder balls 42 with the soldering process, a sectional view of a structure thus obtained is as shown in FIG. 4.

The package-on-package method for an image sensing chip according to the embodiment of the present disclosure is described above. In the package-on-package method, since the circuit board 30 and the image sensing chip package 10 are arranged on the same surface of the control chip package 20 in parallel, that is, the circuit board 30 is located at a lateral side of the image sensing chip package 10, and both the circuit board 30 and the image sensing chip 10 are arranged on the first surface 21a of the second substrate of the control chip package 20, such that the total thickness of the package-on-package structure may not be affected by the thickness of the circuit board 30, and the total thickness of the package-on-package structure is a sum of thicknesses of the image sensing chip package 10 and the control chip package 20. Therefore, compared with the package-on-package structure in the conventional technology, the package-on-package structure according to the embodiments of the present disclosure has a smaller thickness, a better flatness and a simpler structure, thereby reducing a process difficulty, thus facilitating the miniaturization of an image sensor.

The above description is preferred embodiments of the present disclosure, however, it should be noted that several improvements and modifications can be made thereto by those ordinary skilled in the art without departing from the principle of the present disclosure, and these improvements and modifications should also be deemed to be within the protection scope of the present disclosure.

The invention claimed is:

1. A package-on-package structure, comprising:
an image sensing chip package comprising a first substrate and at least one image sensing chip, wherein the first substrate comprises a first surface and a second surface opposite to each other, and the image sensing chip is electrically connected to the first surface of the first substrate;
a control chip package comprising a second substrate and at least one control chip, wherein the second substrate comprises a first surface and a second surface opposite to each other, the first surface of the second substrate comprises a first region and a second region, and the control chip is located on the second surface of the second substrate and is electrically connected to the second surface of the second substrate; and
a circuit board, wherein
the image sensing chip package and the circuit board are located on the first surface of the second substrate, the circuit board is located at a lateral side of the image sensing chip package, the second surface of the first substrate is electrically connected to the first region of the first surface of the second substrate, and the circuit board is electrically connected to the second region of the first surface of the second substrate.

2. The package-on-package structure according to claim 1, wherein
the second surface of the first substrate is adhered to the first region of the first surface of the second substrate through conductive glue, and a back surface of the circuit board is adhered to the second region of the first surface of the second substrate through the conductive glue,
the second surface of the first substrate is electrically connected to the first region of the first surface of the second substrate in a metal bonding manner, and the back surface of the circuit board is electrically connected to the second region of the first surface of the second substrate in the metal bonding manner, or
the second surface of the first substrate is electrically connected to the first region of the first surface of the second substrate through metal solder balls, and the back surface of the circuit board is electrically connected to the second region of the first surface of the second substrate through metal solder balls.

3. The package-on-package structure according to claim 2, wherein the conductive glue is anisotropic conductive glue.

4. The package-on-package structure according to claim 1, wherein the control chip is arranged on the second surface of the second substrate in a flip-chip manner.

5. The package-on-package structure according to claim 4, wherein the control chip package comprises a plurality of the control chips, the plurality of the control chips form a vertical stacking structure, and surfaces of adjacent control chips are not overlapped completely with each other.

6. The package-on-package structure according to claim 5, wherein the control chip is electrically connected to the second surface of the second substrate through a first wire.

7. The package-on-package structure according to claim 1, wherein one control chip is arranged corresponding to at least one image sensing chip.

8. The package-on-package structure according to claim 1, wherein the first substrate is provided with a through hole, the image sensing chip is located in the through hole, and a front surface of the image sensing chip is flush with the first surface of the first substrate.

9. The package-on-package structure according to claim 8, wherein one through hole is provided with at least one image sensing chip, a front surface of each of the at least one image sensing chip is flush with the first surface of the first substrate.

10. The package-on-package structure according to claim 1, wherein the image sensing chip is located on the first surface of the first substrate.

11. The package-on-package structure according to claim 10, wherein the image sensing chip is adhered to the first surface of the first substrate through an adhesive.

12. The package-on-package structure according to claim 1, wherein the front surface of the image sensing chip is provided with a photosensitive region and contact pads located outside the photosensitive region, and each of the contact pads is electrically connected to the first surface of the first substrate through a second wire.

13. The package-on-package structure according to claim 12, wherein the second wire is cladded with a plastic packaging material.

14. The package-on-package structure according to claim 1, wherein the image sensing chip package further comprises: a lens assembly arranged above the first surface of the first substrate.

15. The package-on-package structure according to claim 14, wherein the lens assembly comprises a lens and a lens holder, and the lens holder is fixedly connected to the first surface of the first substrate.

16. The package-on-package structure according to claim 1, wherein the image sensing chip package further comprises: a transparent protective layer formed above the first surface of the first substrate.

17. The package-on-package structure according to claim 16, wherein the transparent protective layer is an anti-reflective glass layer.

18. The package-on-package structure according to claim 16, wherein a sealed cavity is formed between the transparent protective layer and the image sensing chip.

19. A package-on-package method, comprising:
providing an image sensing chip package, a control chip package and a circuit board, wherein the image sensing chip package comprises a first substrate and at least one image sensing chip, the first substrate comprises a first surface and a second surface opposite to each other, and the image sensing chip is electrically connected to the first surface of the first substrate, the control chip package comprises a second substrate and at least one control chip, the second substrate comprises a first surface and a second surface opposite to each other, the first surface of the second substrate comprises a first region and a second region, and the control chip is located on the second surface of the second substrate and is electrically connected to the second surface of the second substrate; and
arranging the image sensing chip package and the circuit board on the first surface of the second substrate in parallel, electrically connecting the first region to the second surface of the first substrate, and electrically connecting the second region to the circuit board.

20. The package-on-package method according to claim 19, wherein
the arranging the image sensing chip package and the circuit board on the first surface of the second substrate in parallel, electrically connecting the first region to the second surface of the first substrate, and electrically connecting the second region to the circuit board comprises one of:
a process of applying conductive glue on at least one of the second surface of the first substrate and the first region of the first surface of the second substrate, and applying the conductive glue on at least one of a back surface of the circuit board and the second region of the first surface of the second substrate; and adhering the second surface of the first substrate to the first region of the first surface of the second substrate through the conductive glue, and adhering the back surface of the circuit board to the second region of the first surface of the second substrate through the conductive glue,
a process of applying a metal solder material on at least one of the second surface of the first substrate and the first region of the first surface of the second substrate, and applying the metal solder material on at least one of a back surface of the circuit board and the second region of the first surface of the second substrate; and soldering the second surface of the first substrate with the first region of the first surface of the second substrate through the metal solder material with a metal bonding process, and soldering the back surface of the circuit board with the second region of the first surface of the second substrate through the metal solder material with the metal bonding process, and
a process of forming metal solder balls on at least one of the second surface of the first substrate and the first region of the first surface of the second substrate and forming metal solder balls on at least one of the back surface of the circuit board and the second region of the first surface of the second substrate; and soldering the second surface of the first substrate with the first region of the first surface of the second substrate through the metal solder balls with a soldering process, and soldering the back surface of the circuit board with the second region of the first surface of the second substrate through the metal solder balls with the soldering process.

* * * * *